US012564071B2

(12) United States Patent
Stiborek

(10) Patent No.: US 12,564,071 B2
(45) Date of Patent: Feb. 24, 2026

(54) LASER ABLATION SURFACE TREATMENT FOR MICROELECTRONIC ASSEMBLY

(71) Applicant: Texas Instruments Incorporated, Dallas, TX (US)

(72) Inventor: Leon Stiborek, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 680 days.

(21) Appl. No.: 16/802,819

(22) Filed: Feb. 27, 2020

(65) Prior Publication Data

US 2020/0273720 A1     Aug. 27, 2020

Related U.S. Application Data

(60) Provisional application No. 62/817,913, filed on Mar. 13, 2019, provisional application No. 62/811,336, filed on Feb. 27, 2019.

(51) Int. Cl.
*H01L 21/48* (2006.01)
*H01L 21/56* (2006.01)
(Continued)

(52) U.S. Cl.
CPC ...... *H01L 21/4842* (2013.01); *H01L 21/4825* (2013.01); *H01L 21/565* (2013.01); *H01L 23/3114* (2013.01); *H01L 23/49503* (2013.01); *H01L 23/4952* (2013.01); *H01L 23/49586* (2013.01); *H01L 23/562* (2013.01); *H01L 24/73* (2013.01); *H01L 24/92* (2013.01); *H01L 2224/73257* (2013.01); *H01L 2224/92227* (2013.01); *H01L 2924/35121* (2013.01)

(58) Field of Classification Search
CPC ........... H01L 23/3114; H01L 23/49503; H01L 23/4952; H01L 23/49586; H01L 23/562
See application file for complete search history.

(56) References Cited

U.S. PATENT DOCUMENTS

2008/0265440 A1* 10/2008 Mahler ............. H01L 23/49586
                                               257/E21.511
2012/0153444 A1*  6/2012 Haga ....................... H01L 24/85
                                               257/737
(Continued)

FOREIGN PATENT DOCUMENTS

JP          09064225      *  3/1997 ............. H01L 23/12

*Primary Examiner* — Steven B Gauthier
*Assistant Examiner* — Marc-Anthony Armand
(74) *Attorney, Agent, or Firm* — Ronald O. Neerings; Frank D. Cimino

(57) ABSTRACT

A method includes removing an oxide layer from select areas of a surface of a metal structure of a lead frame to create openings that extend through the oxide layer to expose portions of the surface of the metal structure. The method further includes attaching a semiconductor die to the lead frame, performing an electrical connection process that electrically couples an exposed portion of the surface of the metal structure to a conductive feature of the semiconductor die, enclosing the semiconductor die in a package structure, and separating the electronic device from the lead frame. In one example, the openings are created by a laser ablation process. In another example, the openings are created by a chemical etch process using a mask. In another example, the openings are created by a plasma process.

20 Claims, 22 Drawing Sheets

(51) Int. Cl.
  *H01L 23/00*   (2006.01)
  *H01L 23/31*   (2006.01)
  *H01L 23/495*   (2006.01)

(56)      References Cited

U.S. PATENT DOCUMENTS

2015/0200181 A1\* 7/2015 Haga ..................... B23K 20/10
                  438/127
2016/0276174 A1\* 9/2016 Kim ........................ H01L 24/92
2019/0304924 A1\* 10/2019 Niu ........................ H05K 1/111

\* cited by examiner

306

1502 — DEPOSIT MASK

1504 — PATTERN MASK

1500

1506 — CHEMICAL ETCHING

1508 — REMOVE MASK

306

2002 — POSITION STENCIL

2004 — PLASMA ETCH

2000

2006 — REMOVE STENCIL

LASER ABLATION SURFACE TREATMENT FOR MICROELECTRONIC ASSEMBLY

REFERENCE TO RELATED APPLICATIONS

Under 35 U.S.C. § 119, this application claims priority to, and the benefit of, U.S. provisional patent application No. 62/811,336, entitled "Concept and Method of Leadframe Selective Removal of Oxides for Enhanced Bondability", and filed on Feb. 27, 2019, the entirety of which is hereby incorporated by reference. Under 35 U.S.C. § 119, this application claims priority to, and the benefit of, U.S. provisional patent application No. 62/817,913, entitled "Precision Laser Ablation Surface Treatment for Microelectronic Assembly", and filed on Mar. 13, 2019, the entirety of which is hereby incorporated by reference.

BACKGROUND

Packaged electronic devices often include a semiconductor die with one or more electronic components mounted to a die attach pad in a molded package structure. The process starts with a lead frame panel or sheet, for example, including copper die attach pad portions, prospective lead portions and other copper features. Bond wires connect bond pads of the die with leads that provide external access for soldering to a host printed circuit board (PCB). Additional bond wires connect further bond pads of the die to a ground ring area of the die pad for grounding or down bonding. Alternatively, or in addition to bond wire connections, metal bumps such as copper pillars or other conductive features of a semiconductor die are sometimes soldered to a die attach pad or other portion of the starting lead frame, for example, using flip-chip attach processes. Following flip-chip attachment and/or wirebonding, a molding process is performed that forms a molded package structure that encloses the die and bond wires. The integrity of the bond wire and direct electrical connections depends on adhesion of the molded material to the lead frame. Delamination or separation of the mold material from the lead frame structure can reduce bond wire connection or stitch integrity, for example, corroded stitches, lifted stitches, short tail problems, etc. Oxide coatings can roughen a lead frame surface and enhance adhesion to molding compound to reduce delamination. However, the oxide layer can prevent or inhibit solder wetting during flip-chip die attach processing, and even using aggressive flux may not be able to promote good solder wetting. Bump landings, prospective bond wire landings and other areas to be soldered can be plated to enhance solder wetting, for example, using Ni/Pd/Au plated materials. However, the plating must be selective as plated areas have poor adhesion to molding compounds, and selective plating adds to production costs.

SUMMARY

According to one aspect, a lead frame is provided, which includes a metal structure, an oxide layer on a surface of the metal structure, and openings extending through the oxide layer to expose portions of the surface of the metal structure. The openings in one example include bump landing arranged to accommodate direct soldering of a metal bump of a semiconductor die to an associated exposed portion of the surface of the metal structure. In another example, the openings include a bond wire attachment location arranged to accommodate direct soldering of a bond wire to an associated exposed portion of the surface of the metal structure.

In accordance with another aspect, a method is provided for fabricating an electronic device. The method includes removing an oxide layer from select areas of a surface of a metal structure of a lead frame to create openings that extend through the oxide layer to expose portions of the surface of the metal structure. The method further includes attaching a semiconductor die to the lead frame, performing an electrical connection process that electrically couples an exposed portion of the surface of the metal structure to a conductive feature of the semiconductor die, enclosing the semiconductor die in a package structure, and separating the electronic device from the lead frame.

In one example, performing the electrical connection process includes attaching a solder wetted metal bump of the semiconductor die to an exposed portion of the surface of the metal structure in a bump landing opening through the oxide layer, and reflowing solder of the solder wetted metal bump to solder the metal bump to the exposed portion of the surface of the metal structure. In another implementation, performing the electrical connection process further includes performing a wire bonding process that solders a first end of a bond wire to an exposed portion of the surface of the metal structure in a bond wire attachment location opening through the oxide layer, and solders a second end of the bond wire to a conductive feature of the semiconductor die.

In one example, removing the oxide layer includes performing a laser ablation process that removes the oxide layer from the select areas of the surface of the metal structure of the lead frame to create the openings that extend through the oxide layer to expose portions of the surface of the metal structure. In another example, removing the oxide layer includes performing a chemical etch process using a mask to remove the oxide layer from the select areas of the surface of the metal structure of the lead frame to create the openings that extend through the oxide layer to expose portions of the surface of the metal structure. In another example, removing the oxide layer includes performing a plasma process using a stencil to remove the oxide layer from the select areas of the surface of the metal structure of the lead frame to create the openings that extend through the oxide layer to expose portions of the surface of the metal structure.

In accordance with another aspect, an electronic device includes a semiconductor die supported in a package structure, as well as a metal structure, including an oxide layer on a surface of the metal structure, and openings that extend through the oxide layer to expose portions of the surface of the metal structure. The electronic device further includes an electrical connection between a conductive feature of the semiconductor die and an exposed portion of the surface of the metal structure in one of the openings through the oxide layer. In one example, the openings include a bump landing soldered to a metal bump of the semiconductor die. In another example, the openings further include a bond wire attachment location soldered to a bond wire. In one example, the openings are laser ablated through the oxide layer to expose the portions of the surface of the metal structure. In another example, the openings are chemical etched through the oxide layer to expose the portions of the surface of the metal structure. In another example, the openings are plasma etched through the oxide layer to expose the portions of the surface of the metal structure.

DETAILED DESCRIPTION

Figure 1:
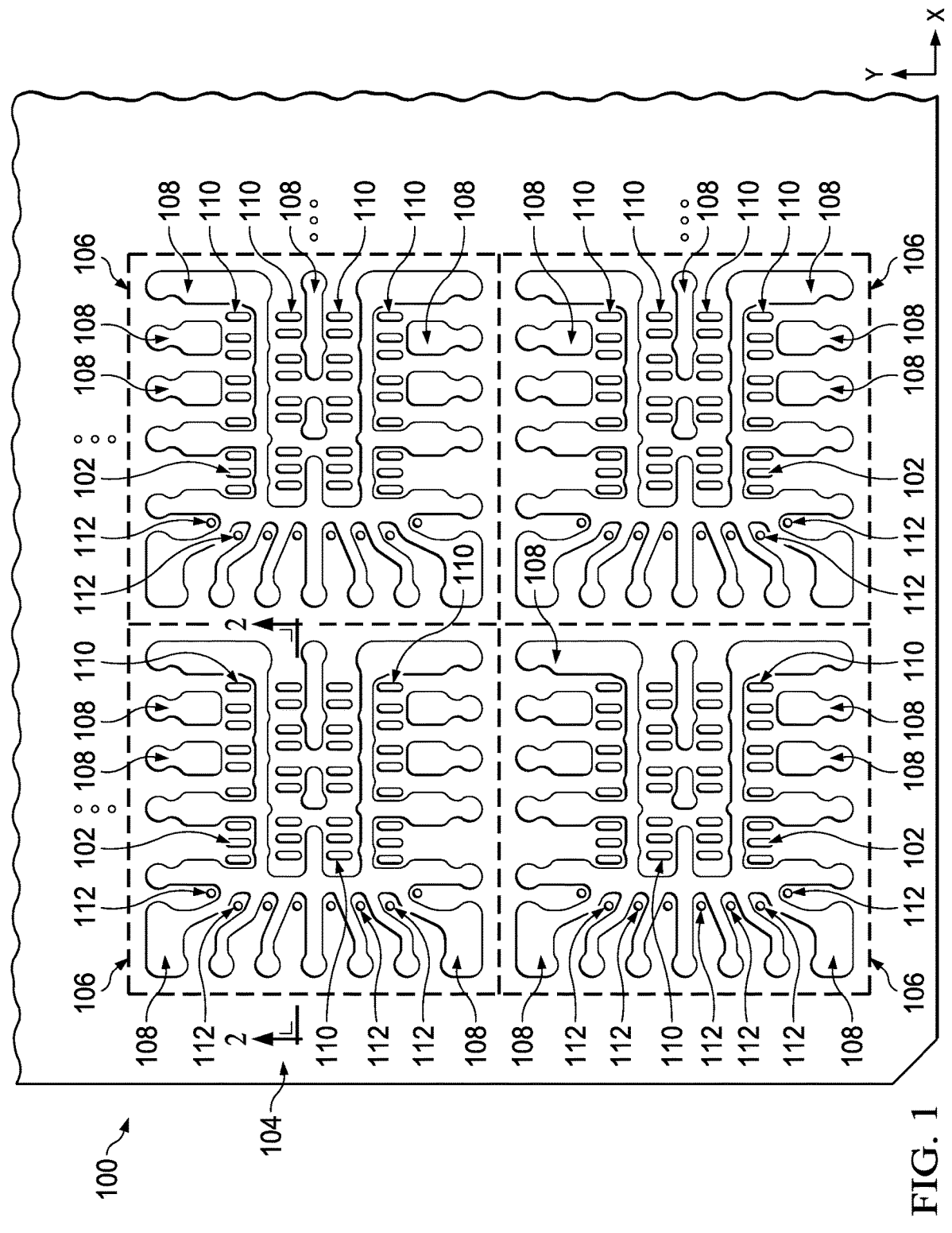
FIG. 1 is a partial top plan view of a lead frame according to an embodiment.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 2:
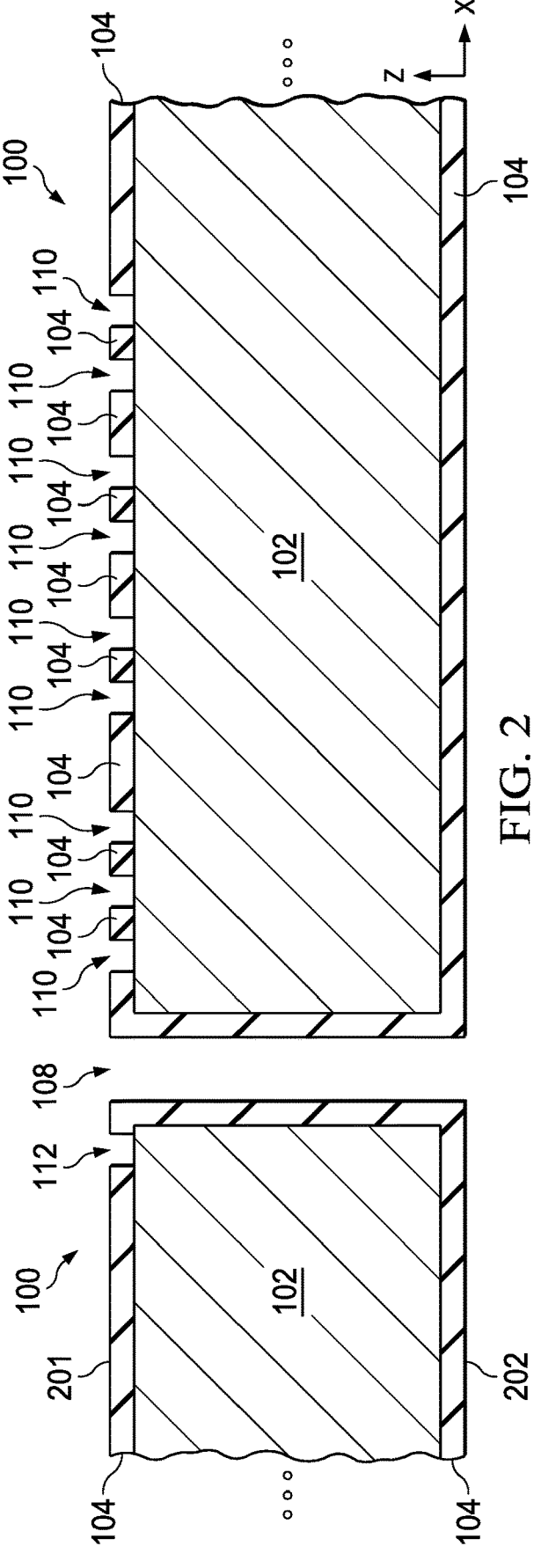
FIG. 2 is a partial sectional side elevation view of the lead frame taken along line 2-2 in FIG. 1.

FIGS. 1 and 2 show a lead frame 100 according to an embodiment. FIG. 1 shows a top view of the lead frame 100 and FIG. 2 shows a partial section view of the lead frame 100 taken along line 2-2 in FIG. 1. The lead frame 100 includes a metal structure 102, such as copper, aluminum, or other conductive material. The starting lead frame 100 in FIG. 1 includes patterned features such as holes to define die attach pads, leads, and other conductive metal structural features of a prospective electronic device following subsequent cutting to separate packaged electronic devices from the lead frame. In other example, the metal structure 102 can include raised portions, indents and/or other surface features (not shown).

The starting lead frame 100 in FIGS. 1 and 2 includes an oxide layer or coating 104 on outer surfaces of the metal structure 102. In one implementation, the metal structure 102 is exposed to an oxidizing environment at a controlled temperature for a controlled period of time to oxidize the outer surfaces of the metal structure and to form the oxide layer 104 to a desired thickness. In one example, the metal structure is copper (Cu) with holes, undercuts and other structural and surface features formed by stamping, punching, chemical etching, rolling, grinding, etc.

The patterned metal structure 102 is exposed to an oxidizing environment at a controlled temperature to form a copper oxide layer 104 $Cu_xO$, such as cupric oxide (CuO) or cuprous oxide ($Cu_2O$). Suitable oxidizing agents for forming the oxide layer 104 on a copper metal structure 102 include acetic acid, barium sulphide, ammonium sulfide, and sulfuric acid. In one example, the oxide layer 104 has a brownish or reddish color with a generally rough surface compared to that of pure copper. As discussed above, the oxide layer 104 provides better adhesion to molding compound to mitigate delamination of the molded package structure from surfaces of the lead frame 100.

The example lead frame 100 is a sheet or panel with multiple prospective electronic device areas or portions 106, formed in rows and columns, where FIG. 1 shows four example prospective electronic device areas 106. The individual electronic device areas 106 in this example include holes 108 that extend through the metal structure 102, as well as openings 110 and 112 that extend through the oxide layer 104 to expose portions of the surface of the metal structure 102. The oxide layer 104 facilitates adhesion to molding compound material, while the exposed portions of the surface of the metal structure facilitate solder wetting for flip-chip die attach and/or bond wore connections. The openings 110 and 112, moreover, provide cost and complexity advantages compared to selective plating using Ni/Pd/Au or other plated materials for solder connection areas of a starting lead frame.

As shown in FIG. 2, the example lead frame 100 is a generally planar structure with respective first and second (e.g., top and bottom) sides 201 and 202. The oxide layer 104 extends along the second side 202 of the metal structure 102, as well as along the side walls of the holes 108 that extend through the metal structure 102 from the first side 201 to the second side 202. In this example, the openings 110 and 112 extend through the oxide layer 104 to expose select portions of the surface of the metal structure 102 along the first side 201 of the lead frame 100. The oxide layer 104 extends along portions of the first side 201 between the openings 110 and 112. The openings in this example include bump landings 110 arranged to accommodate direct soldering of a metal bump of a semiconductor die (e.g., FIG. 9 below) to an associated exposed portion of the surface of the metal structure 102, as well as bond wire attachment locations or landings 112 arranged to accommodate direct soldering of a bond wire to an associated exposed portion of the surface of the metal structure 102.

Figure 3:
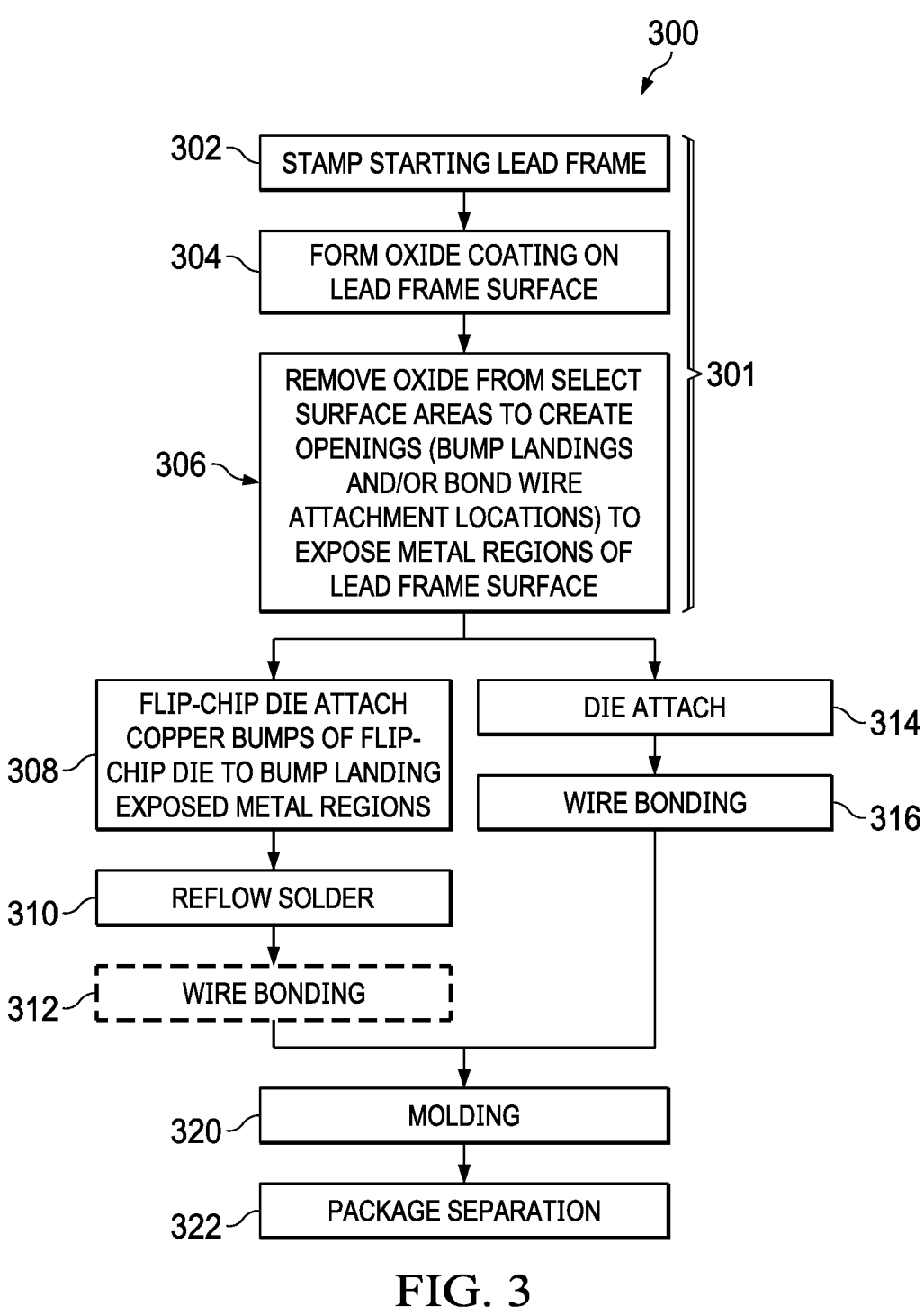
FIG. 3 is a flow diagram of a method for fabricating a packaged electronic device according to another embodiment.
Figure 4:
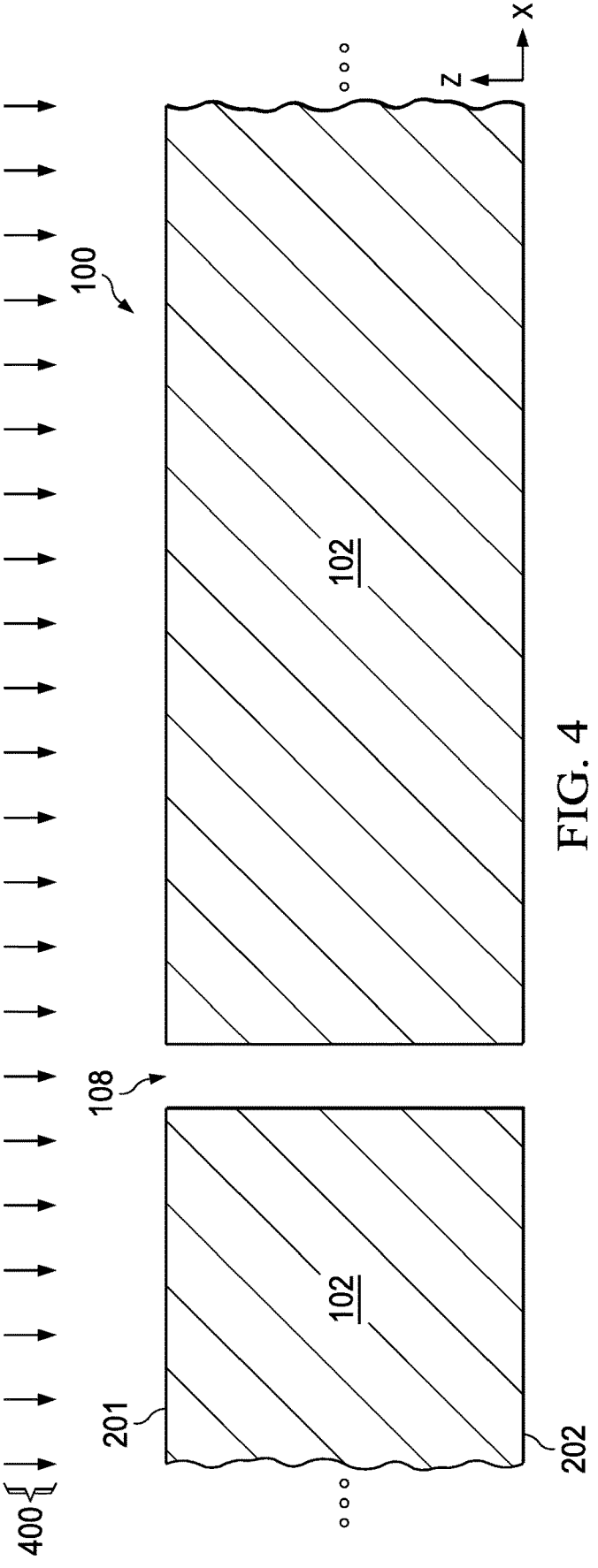
FIG. 4 is a partial sectional side elevation view of the lead frame metal structure prior to formation of an oxide layer.
Figure 5:
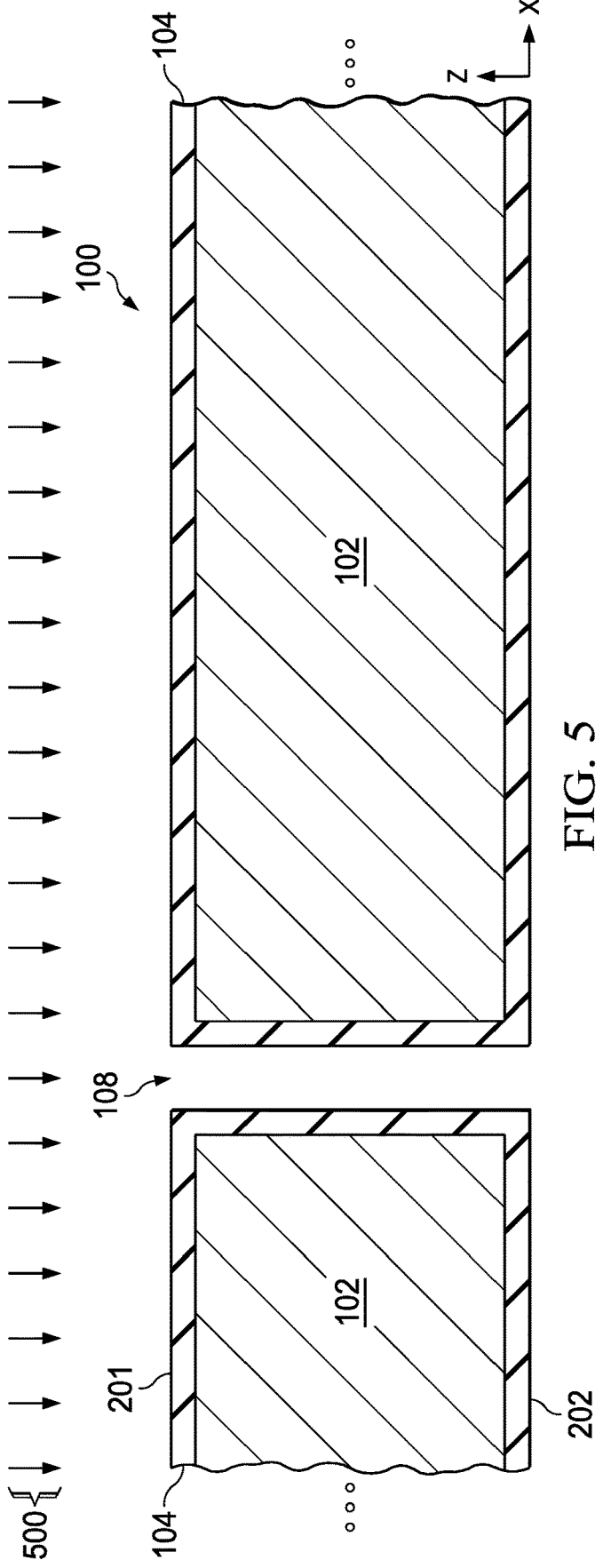
FIG. 5 is a partial sectional side elevation view of the lead frame metal structure undergoing an oxide formation process.

Referring now to FIGS. 3-14, FIG. 3 shows a method 300 for fabricating a packaged electronic device and FIGS. 4-14 show fabrication of an example packaged electronic device using the starting lead frame 100 according to the method 300. The method 300 includes lead frame fabrication processing at 301, beginning with stamping the starting lead frame at 302. FIG. 4 shows one example, in which a stamping process 400 is performed that forms the holes 108 that extend between the first and second sides 201 and 202 of the metal structure 102. In another example, the starting metal structure 102 is etched to form the holes 108. The method 300 continues with forming an oxide coating on the lead frame surfaces at 304. FIG. 5 shows one example, in which an oxidation process 500 is performed that forms the oxide layer 104 along the exposed surfaces of the stamped metal structure 102, including along the side walls of the holes 108.

Figure 6:
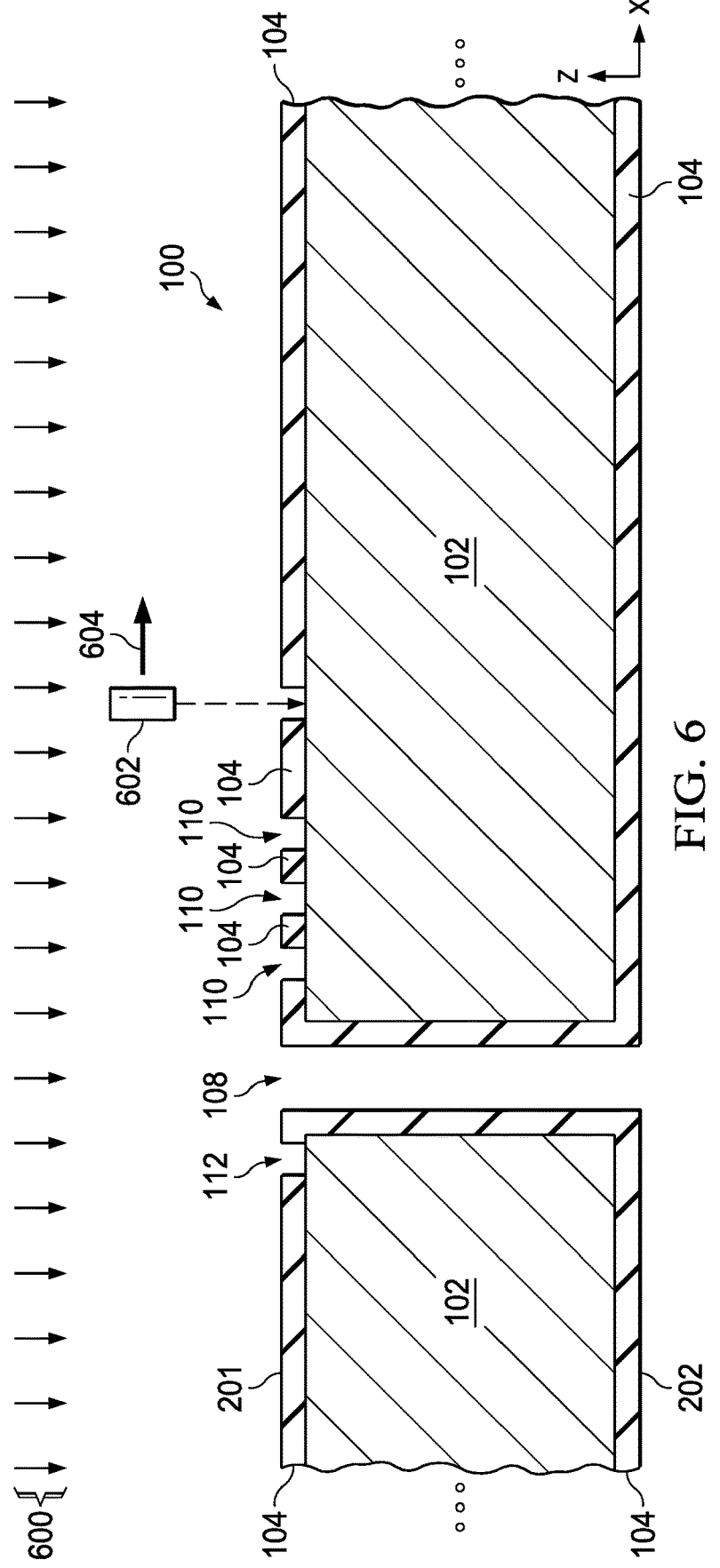
FIG. 6 is a partial sectional side elevation view of the lead frame undergoing a laser ablation process to remove the oxide layer from of the metal structure.
Figure 7:
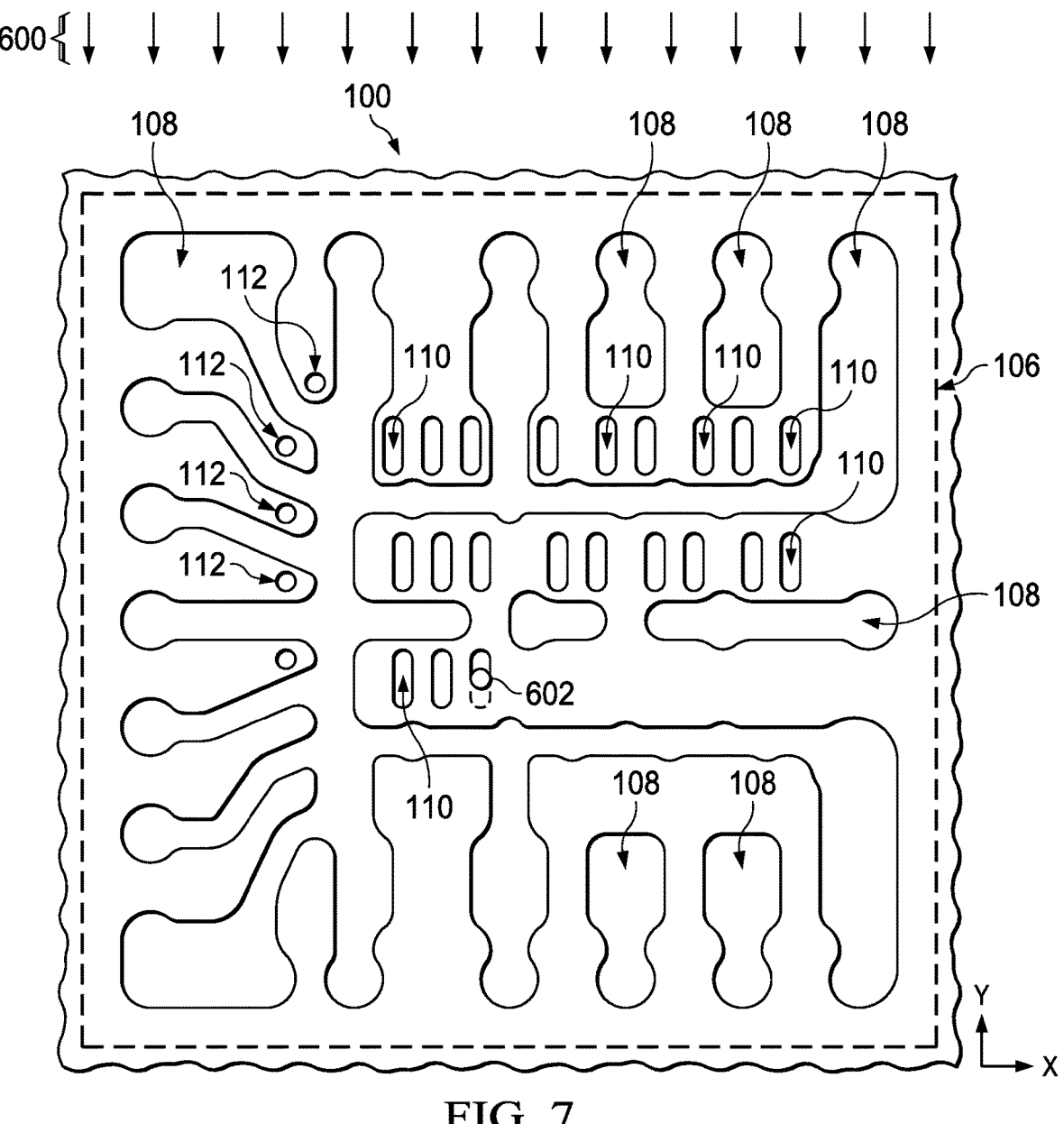
FIG. 7 is a top plan view of the lead frame undergoing the laser ablation process to remove the oxide layer from of the metal structure.
Figure 8:
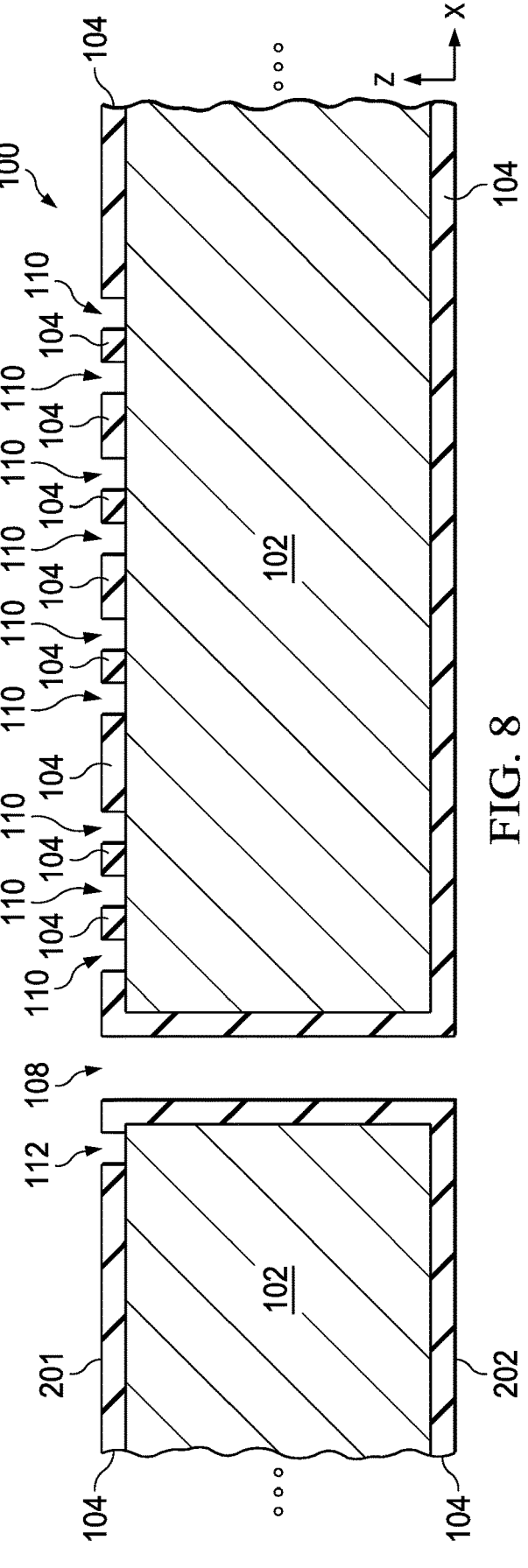
FIG. 8 is a partial sectional side elevation view of the lead frame following the laser ablation process.

The method 300 continues at 306 with selectively removing the oxide layer 104 from select areas of a surface of the metal structure 102 to create the openings 110 and/or 112 that extend through the oxide layer 104 to expose portions of the surface of the metal structure 102. FIGS. 6-8 show one example, in which a laser ablation process 600 is performed in FIGS. 6 and 7 by raster scanning a laser 602 along a direction or path 604 to selectively ablate or otherwise remove select portions of the oxide layer 104 to create the openings 110 and 112. In one implementation, the laser 602 is supported above the first side 201 of the lead frame 100 as shown in FIG. 6, and the laser 602 is scanned in the X and/or Y directions as shown in FIG. 7 while laser power is selectively controlled to create the openings 110 and/or 112 that extend through the oxide layer 104 to expose portions of the surface of the metal structure 102. FIG. 7 shows the position of the laser 602 during formation of one of the bump landing openings 110. FIG. 8 shows a side view of the lead frame 100 following the laser ablation process 600, including the example openings 110 and 112 of FIGS. 1 and 2 above. In another implementation, the selective oxide removal at 306 includes chemical etching as described further below in connection with FIGS. 15-19. In another implementation, the selective oxide removal at 306 includes plasma etching as described further below in connection with FIGS. 20-23.

Figure 9:
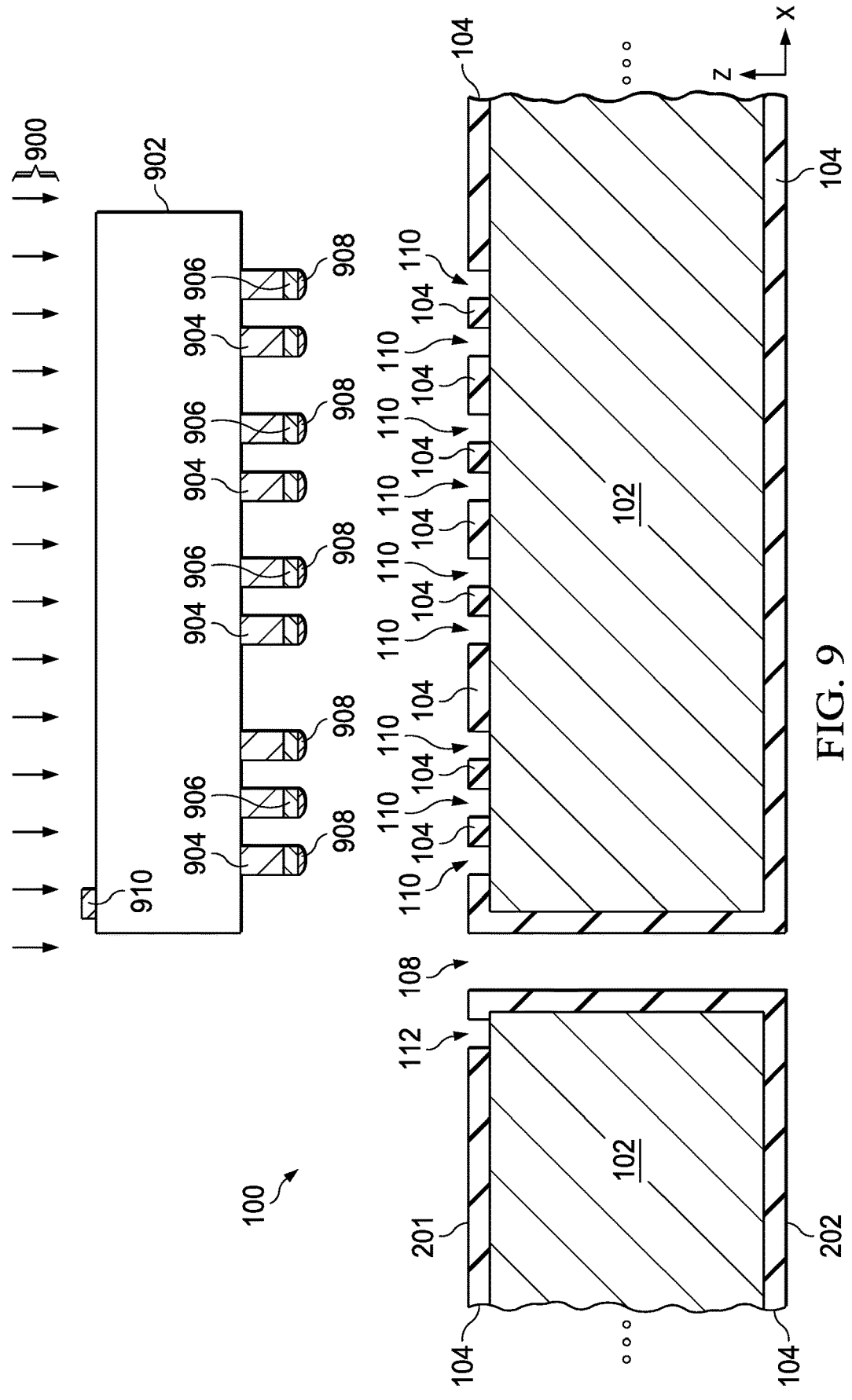
FIGS. 9 and 10 are partial sectional side elevation views of a flip chip die attach process to attach a semiconductor die to the lead frame.
Figure 10:
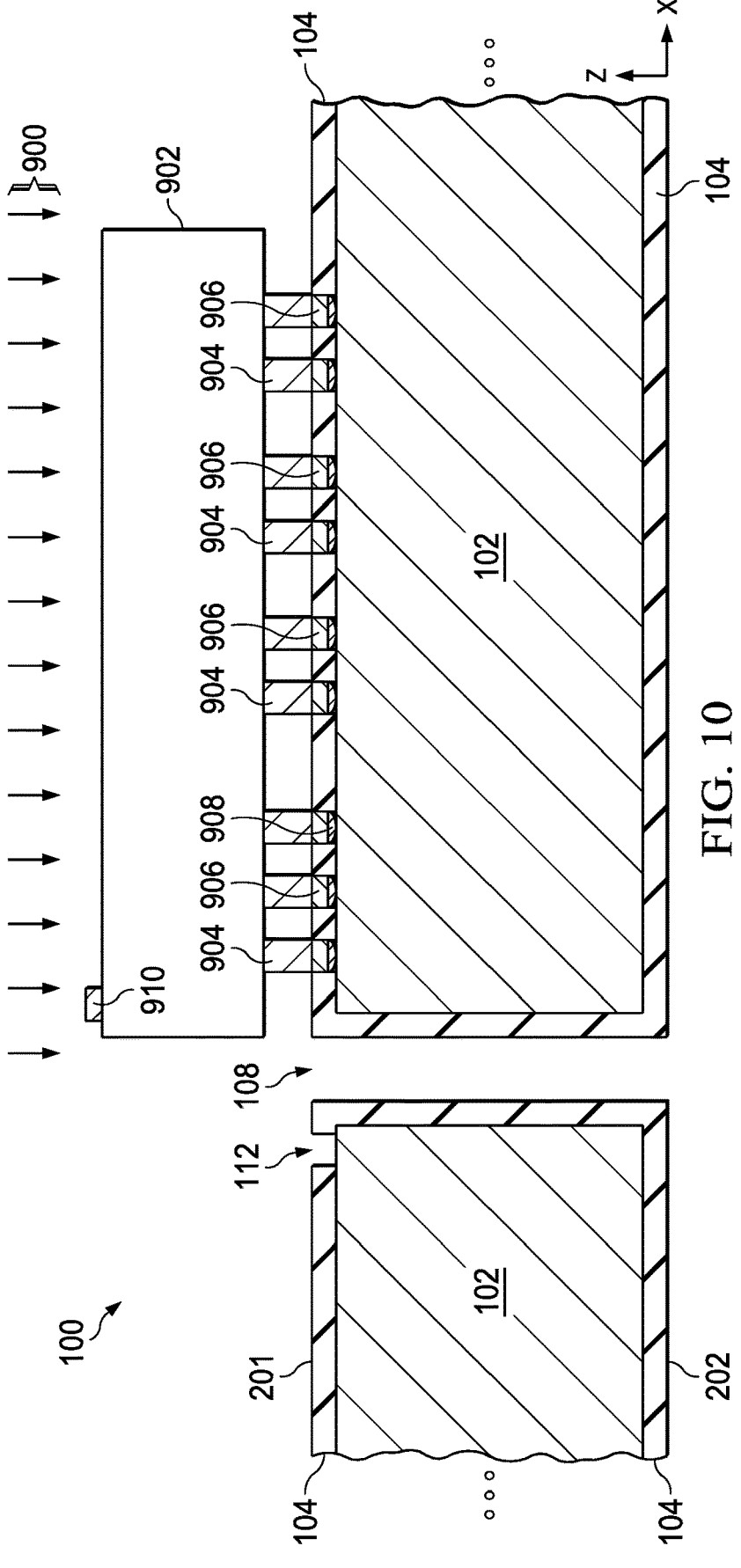

The method 300 continues with attaching a semiconductor die to the lead frame 100 and performing an electrical connection process that electrically couples an exposed portion of the surface of the metal structure 102 to a conductive feature of the semiconductor die. In one example in FIG. 3 at 308, the method 300 includes flip-chip die attachment of copper bumps of a semiconductor die to exposed portions of the metal structure 102 in one or more of the bump landing openings 110. FIGS. 9 and 10 show one example, in which a flip-chip die attach process 900 is performed that attaches a semiconductor die 902 to the lead frame 100. The semiconductor die 902 in this example includes conductive (e.g., copper) pillars or bumps 904 with solder tips 906 and liquid flux 908 on a lower side thereof, as well as a conductive (e.g., copper) bond pad 910 on an upper side. In FIG. 9, the semiconductor die 902 is positioned above the first side 201 of the lead frame 100 with the solder wetted metal bumps 904 of the semiconductor die 902 aligned above respective exposed portions of the surface of the metal structure 102 corresponding bump landing openings 110 through the oxide layer 104. The flip-chip die attach process 900 continues in FIG. 10 with translation of the semiconductor doe 902 downward (along the Z direction in FIG. 10) to engage attach the solder wetted metal bumps 904 to the exposed portions of the surface of the metal structure 102 in the bump landing openings 110.

Figure 11:
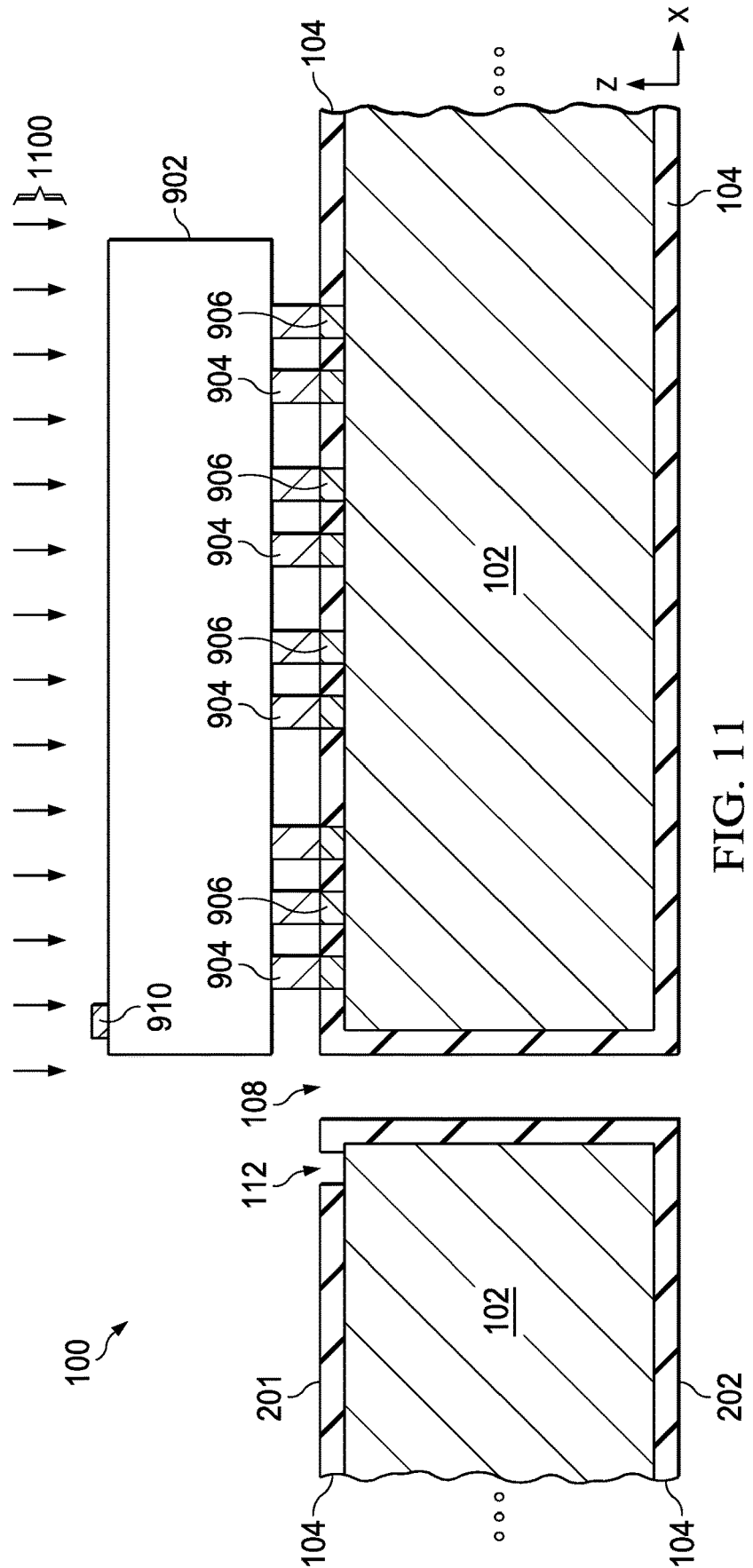
FIG. 11 is a partial sectional side elevation view of the lead frame undergoing a solder reflow process to solder conductive bond features of the semiconductor die through the openings to the metal structure of the lead frame.

At 310 in FIG. 3, the method 300 further includes electrical connection processing by reflowing the solder 906. FIG. 11 shows one example, in which a thermal reflow process 1100 is performed that reflows the solder wetted metal bumps to solder the metal bumps 904 to the respective exposed portions of the surface of the metal structure 102. This creates solder connections that electrically couple the exposed portions of the surface of the metal structure 102 in the openings 110 to respective conductive features 904 of the semiconductor die 902.

Figure 12:
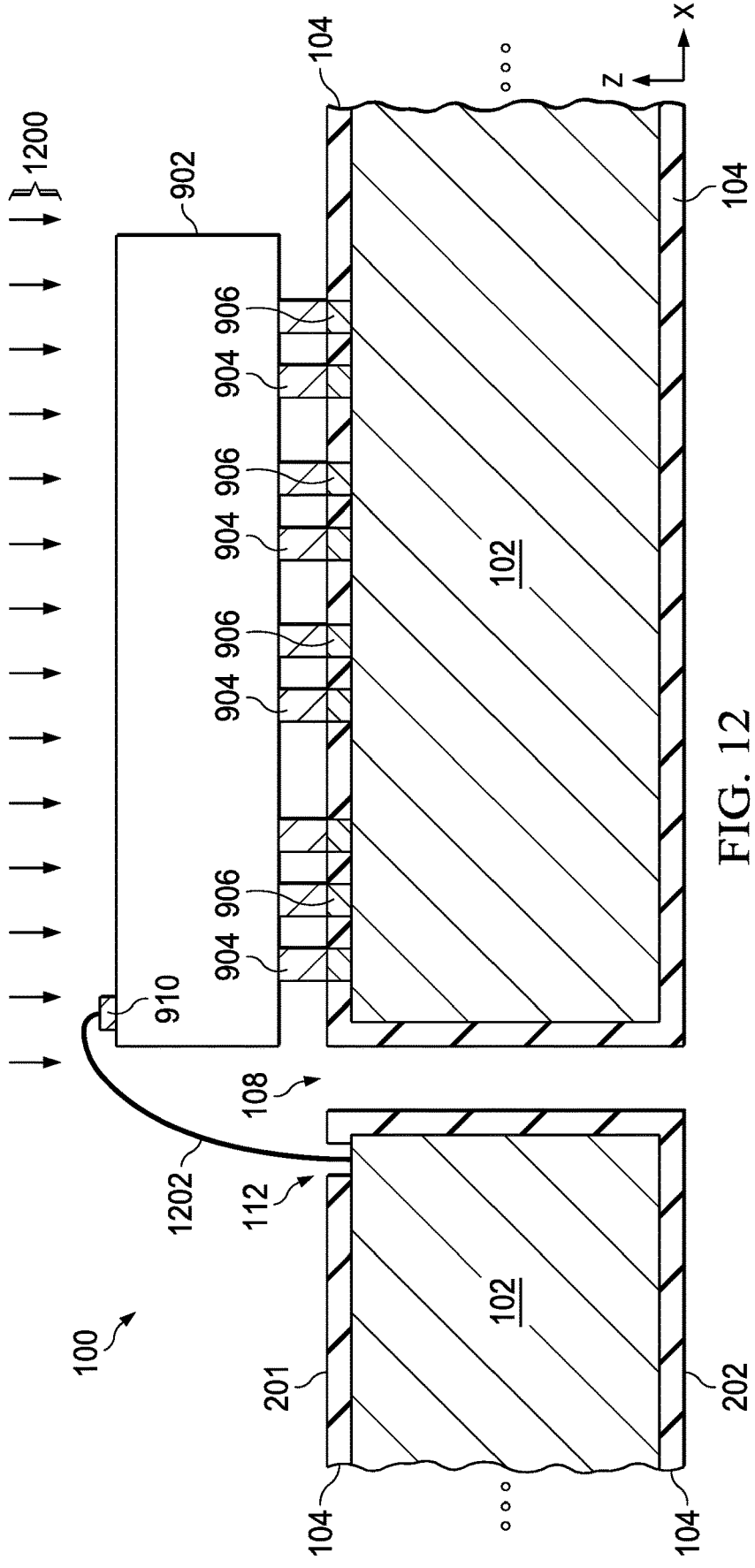
FIG. 12 is a partial sectional side elevation view of the lead frame undergoing a wire bonding process to solder a bond wire from a conductive feature of the semiconductor die through another opening to the metal structure of the lead frame.

In one implementation, the electrical connection processing further includes wire bonding at 312. FIG. 12 shows one example, in which a wire bonding process 1200 is performed that solders a first end of a bond wire 1202 to an exposed portion of the surface of the metal structure 102 in a bond wire attachment location opening 112 through the oxide layer 104, and solders a second end of the bond wire 1202 to a conductive feature (e.g., bond pad) 910 of the semiconductor die 902.

In another implementation without flip-chip processing, the method 300 includes attaching a semiconductor die to a die attach pad or other support structure at 314 (e.g., via adhesive), and wire bond processing at 316 to electrically couple exposed portions of the surface of the metal structure 102 in the bond wire attachment location openings 112 to respective conductive features (e.g., bond pads, not shown) of the attached semiconductor die 902.

Figure 13:
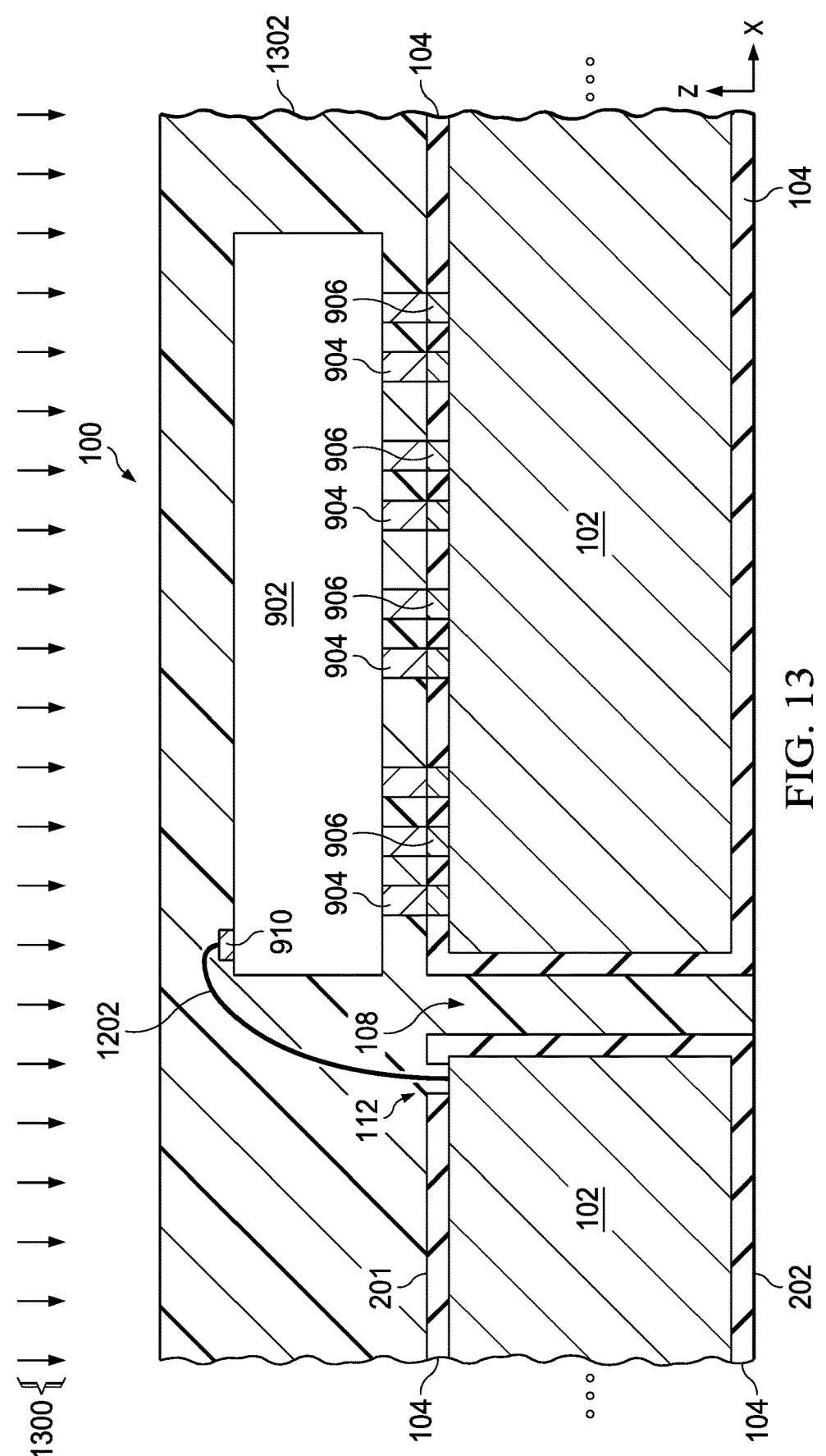
FIG. 13 is a partial sectional side elevation view of the lead frame undergoing a molding process to form a package structure.

The method 300 further includes molding at 320 in FIG. 3. FIG. 13 shows one example, in which a molding process 1300 is performed that encloses the semiconductor die 902, the bond wire 1202 and portions of the lead frame 100 in a package structure 1302, such as a molding compound.

Figure 14:
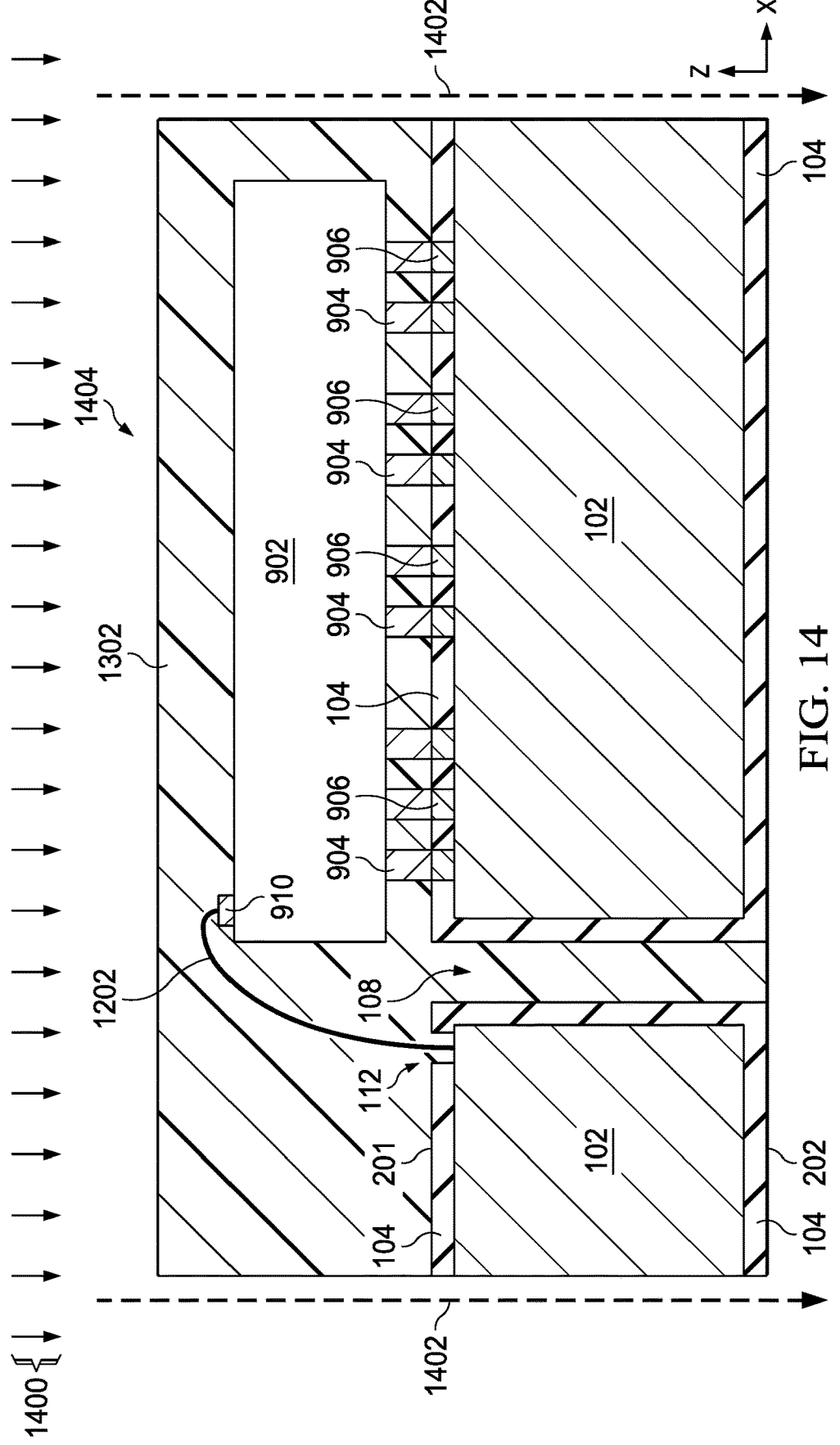
FIG. 14 is a partial sectional side elevation view of the lead frame undergoing a package separation process to separate a packaged electronic device from the lead frame.

The method 300 also includes package separation at 322. FIG. 14 shows one example, in which a laser or saw cutting process 1400 is performed that cuts through the lead frame and molding compound along cut lines 1402 to separate a packaged electronic device 1404 from the lead frame 100.

The electronic device 1404 in FIG. 14 includes the semiconductor die 902 supported in the package structure 1302, as well as the remaining portions of the metal structure 102 of the starting lead frame 100, and the electrical connections 906 and 1202. The metal structure 102 includes the oxide layer 104 on a surface of the metal structure 102, and the openings 110 and 112 that extend through the oxide layer 104 to expose portions of the surface of the metal structure 102. The electrical connections 906 and 1202 couple conductive features 904 and 910 of the semiconductor die 902 to respective exposed portions of the surface of the metal structure 102 in a respective one of the openings 110 and 112 through the oxide layer 104.

In this example, moreover, the openings 110 and 112 are laser ablated through the oxide layer 104 to expose the portions of the surface of the metal structure 102. In this example, the laser 602 is operated by suitable robotic positioning apparatus (not shown) to precisely ablate and expose oxide layers, polymer coatings, or other outgassed materials from the interconnecting metal structure 102 in the select areas of the openings 110 and 112 for improved solder wettability and wire bond interconnect assembly. In one example, the laser 602 is a suitable laser type, such as YAG, UV, CO2, etc., and the laser processing 600 uses suitable cover gasses tailored to best react with the base material of the oxide layer 104 to be removed.

Laser ablation has advantages over other etching or removal processes, for example, by mitigating or avoiding contaminates that plasma or other processes cannot remove from precise locations. The described examples provide the solderability enhancements in combination with enhanced mold compound material adhesion of the oxide coating layer 104 without requiring aggressive fluxes or extra costly Ni/Pd/Au selective plating processing for lead frames. In the described examples, selective oxide removal processing is used and applied only to required areas to be soldered, such as landing areas for wire bond pads and solder bump interconnects.

Figure 15:
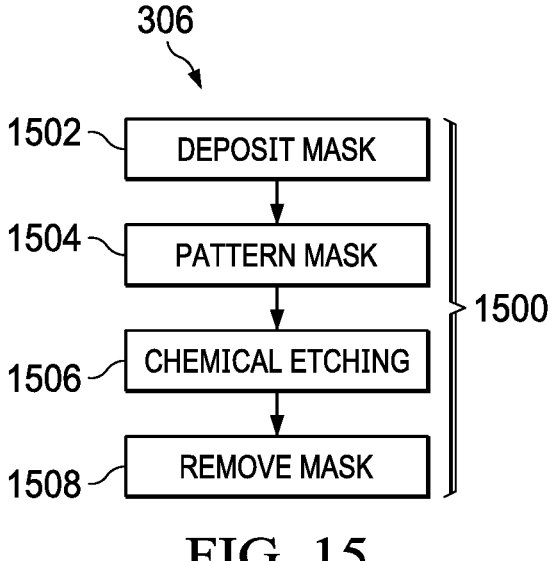
FIG. 15 is a flow diagram illustrating a chemical etching process to remove oxide from select surface areas of the lead frame in another embodiment of the process of FIG. 3.
Figure 16:
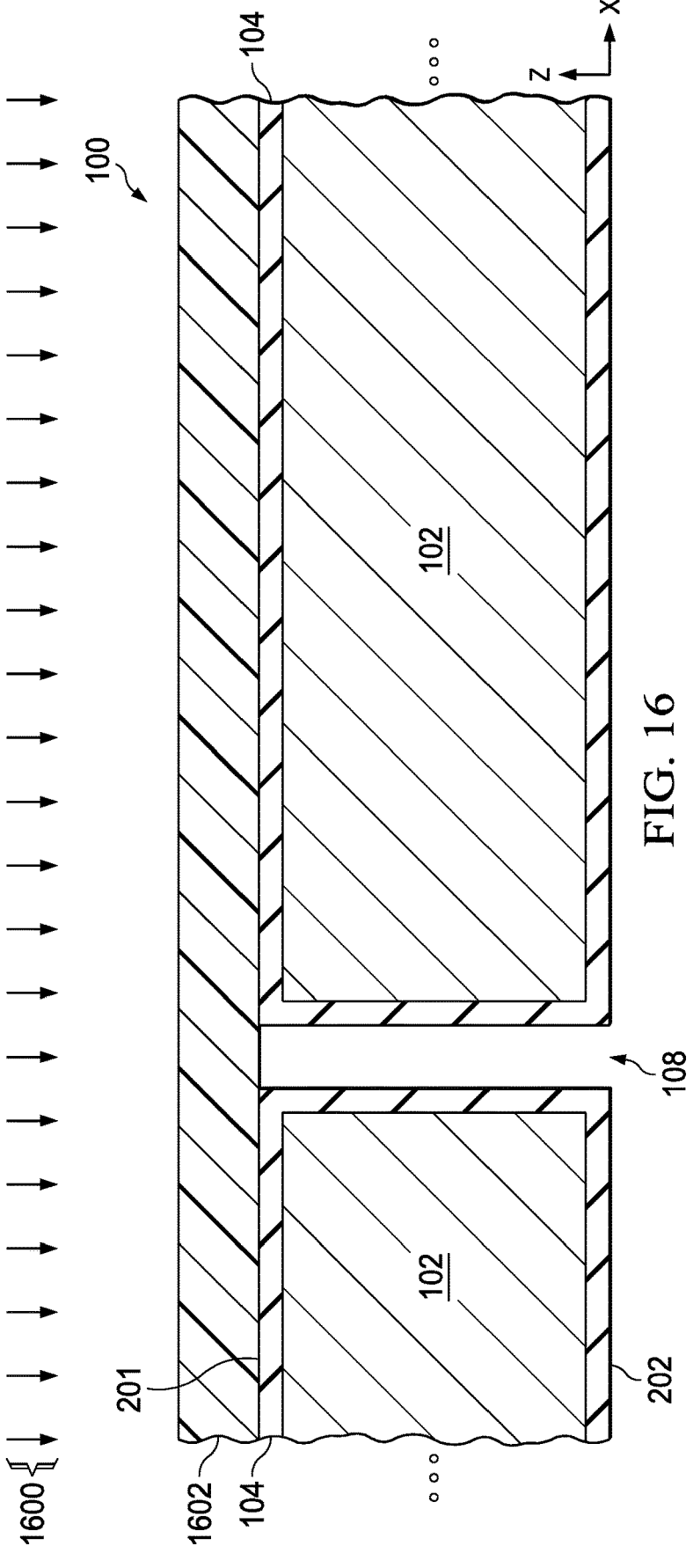
FIG. 16 is a partial sectional side elevation view of the lead frame undergoing a deposition process to deposit a mask material on a top side of the lead frame.
Figure 17:
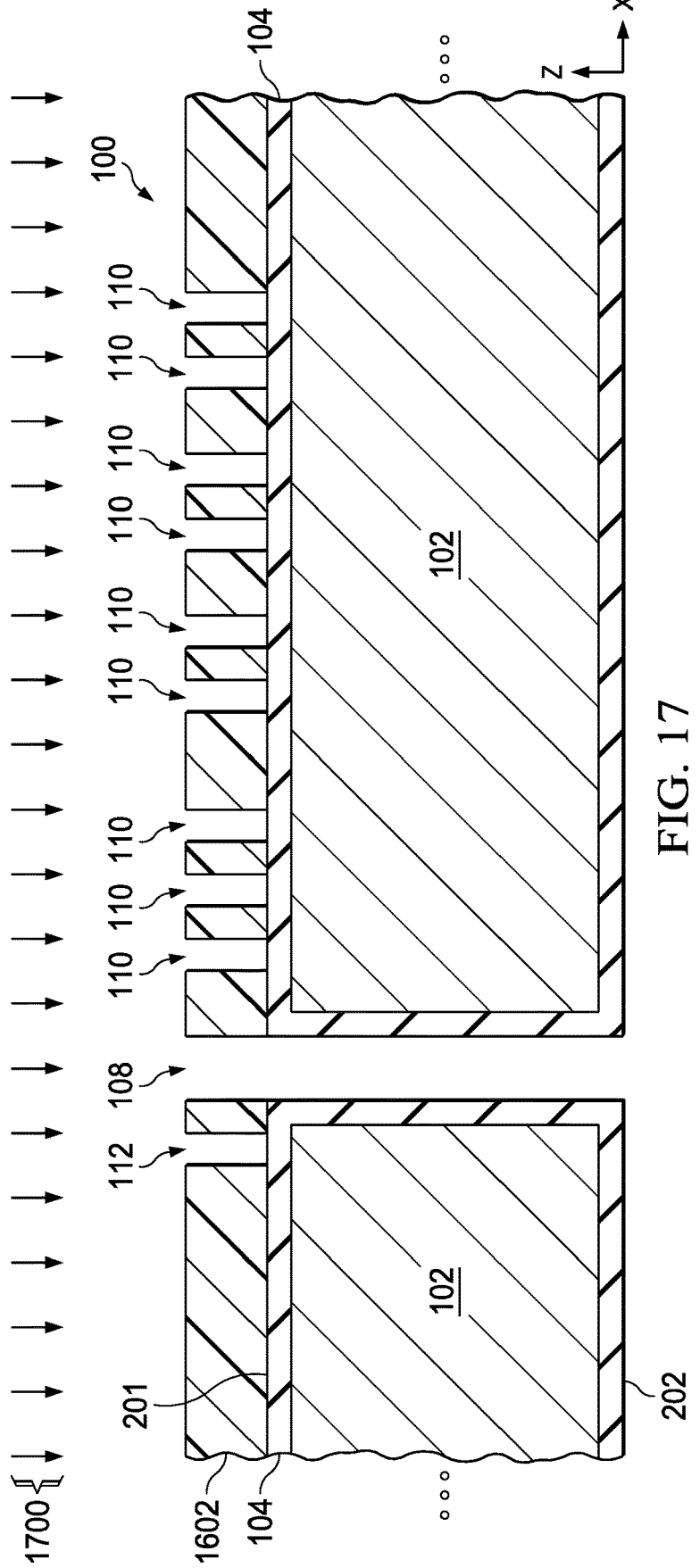
FIG. 17 is a partial sectional side elevation view of the lead frame undergoing a process to pattern the mask on the topside of the lead frame to expose perspective openings through the oxide layer.

Referring now to FIGS. 15-19, in another example, the openings 110 and 112 are chemical etched through the oxide layer to expose the portions of the surface of the metal structure. FIG. 15 shows a chemical etching process 1500 that can be used as the oxide removal step 306 in the method 300 of FIG. 3 above to remove oxide from select surface areas of the lead frame in another embodiment. FIGS. 16-19 show the example lead frame 100 undergoing processing according to the chemical etching process 1500 of FIG. 15. The processing 1500 includes depositing a mask at 1502 and patterning the mask at 1504. FIG. 16 shows one example, in which a deposition process 1600 is performed that forms a photo mask layer 1602 on the first side 201 of the lead frame 100. FIG. 17 shows one example, in which a lithography process 1700 exposes select portions of the mask material 1602 to light to create a patterned mask 1602 with openings along the first side 201 of the lead frame 100 corresponding to the desired oxide layer openings 110 and 112.

Figure 20:
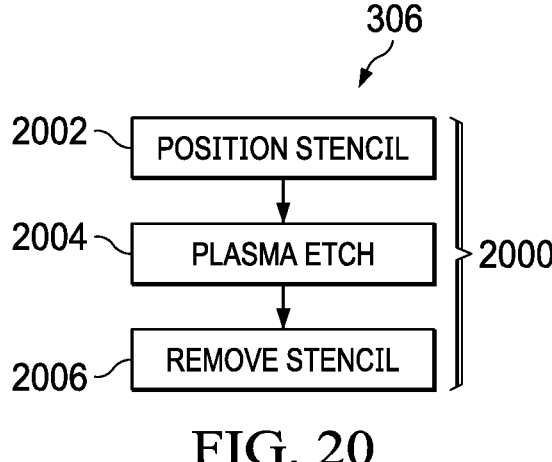
FIG. 20 is a flow diagram illustrating a plasma etching process to remove oxide from select surface areas of the lead frame in another embodiment of the process of FIG. 3.
Figure 18:
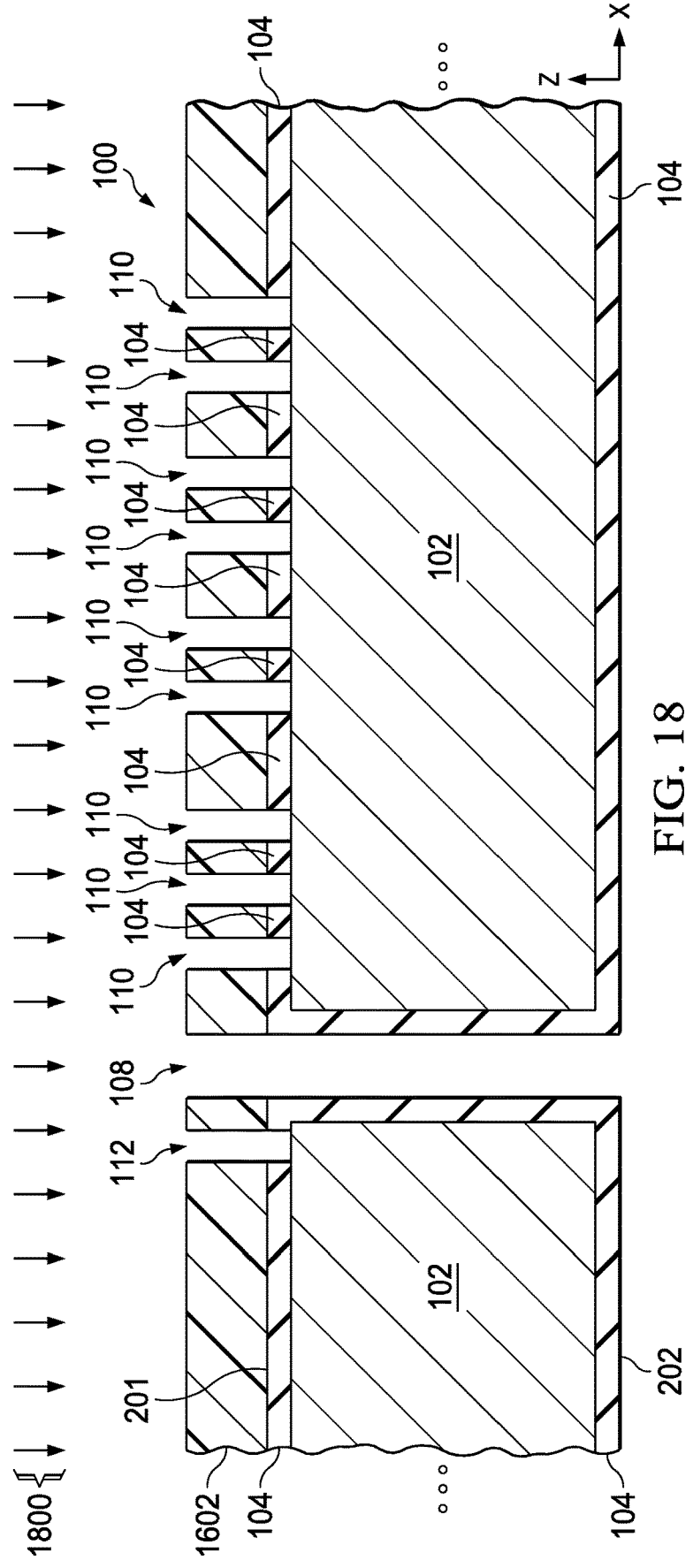
FIG. 18 is a partial sectional side elevation view of the lead frame undergoing a chemical etch process to remove oxide from select surface areas to create openings through the oxide layer.
Figure 19:
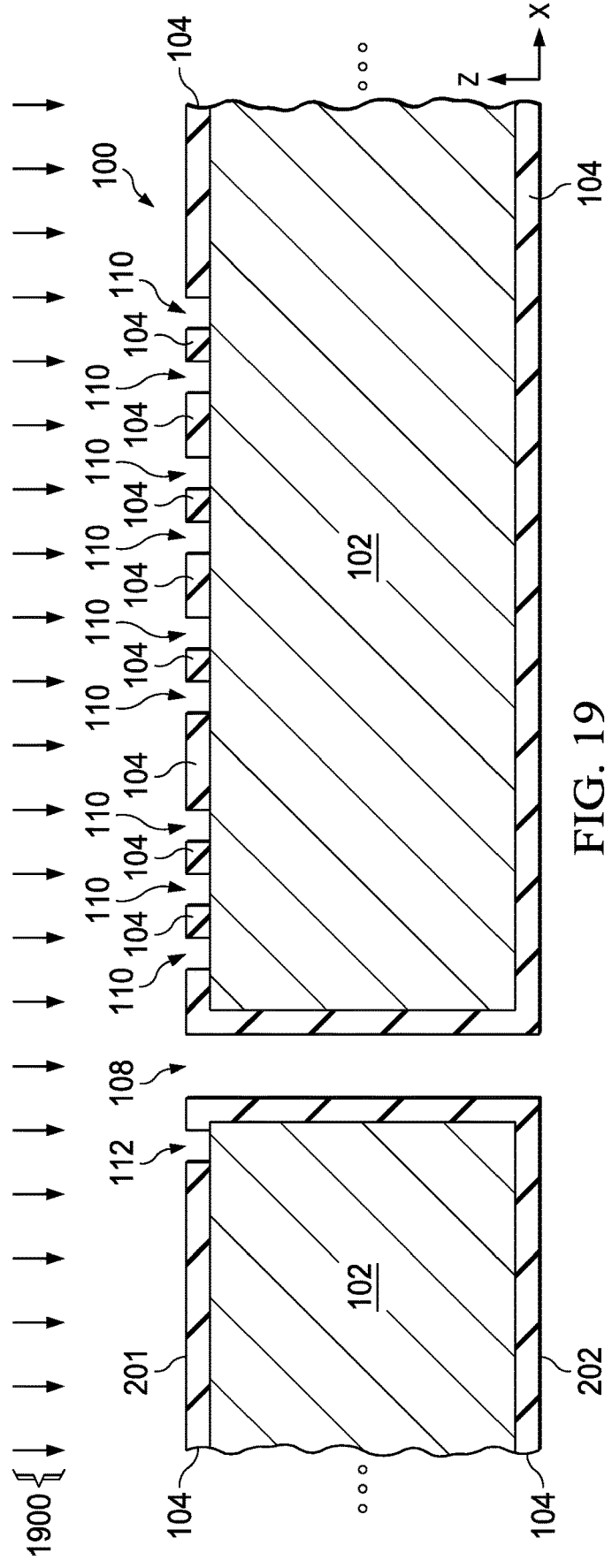
FIG. 19 is a partial sectional side elevation view of the lead frame following removal of the etch mask.

The process 1500 in FIG. 15 further includes chemical etching at 1506 and mask removal at 1508. FIG. 18 shows one example, in which a chemical etch process 1800 is performed that etches through the exposed portions of the oxide layer 104 in the openings of the patterned mask 1602. The etching creates the openings 110 and 112 through the oxide layer 104 along the first side 201 of the lead frame 100. FIG. 20 shows one example after removal of the etch mask 1602.

Figure 21:
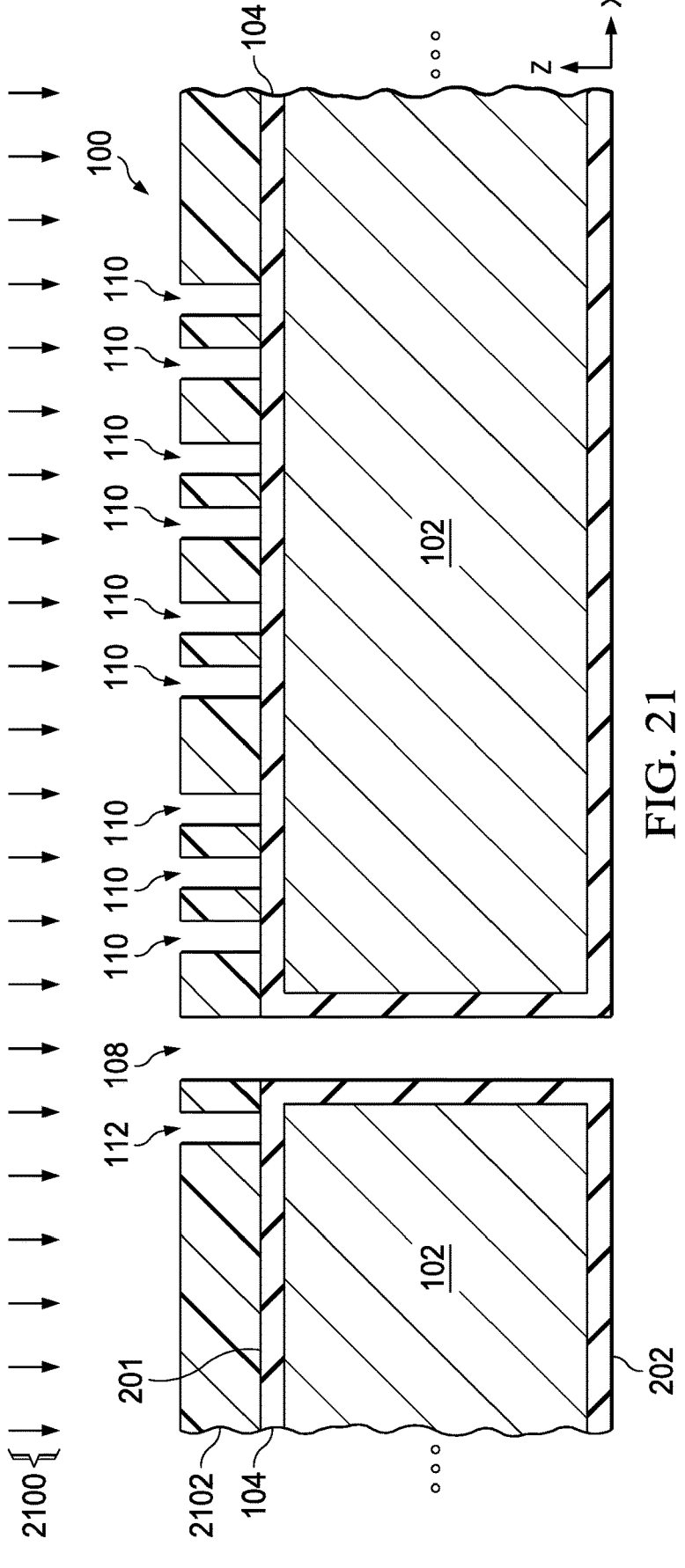
FIG. 21 is a partial sectional side elevation view of the lead frame showing placement of a stencil on a top side of the lead frame.

Referring also to FIGS. 20-23, in other embodiments, the openings 110 and 112 are plasma etched through the oxide layer 104 to expose the portions of the surface of the metal structure 102. FIG. 20 shows a plasma etching process 2000 that can be used as the oxide removal step 306 in the method 300 of FIG. 3 above to remove oxide from select surface areas of the lead frame in another embodiment. At 2002 in FIG. 20, a stencil is positioned to cover portions of the oxide layer 104 that are not to be removed. FIG. 21 shows one example, in which a stencil placement process 2100 is performed that positions a stencil 2102 on the first side 201 of the lead frame 100. The stencil in this example has openings positioned to expose select portions of the oxide layer 104 that correspond to the desired locations of the prospective oxide layer openings 110 and 112.

Figure 22:
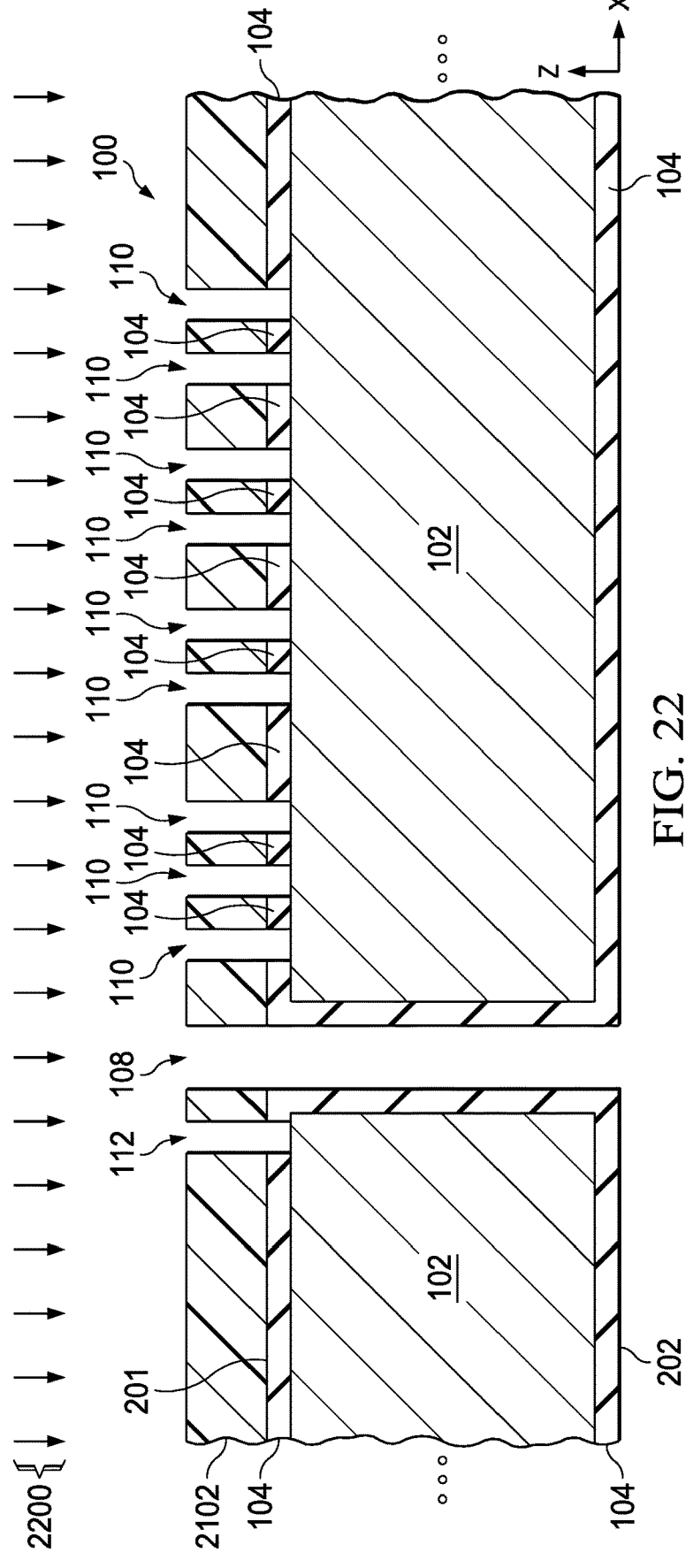
FIG. 22 is a partial sectional side elevation view of the lead frame undergoing a plasma etch process using the stencil.
Figure 23:
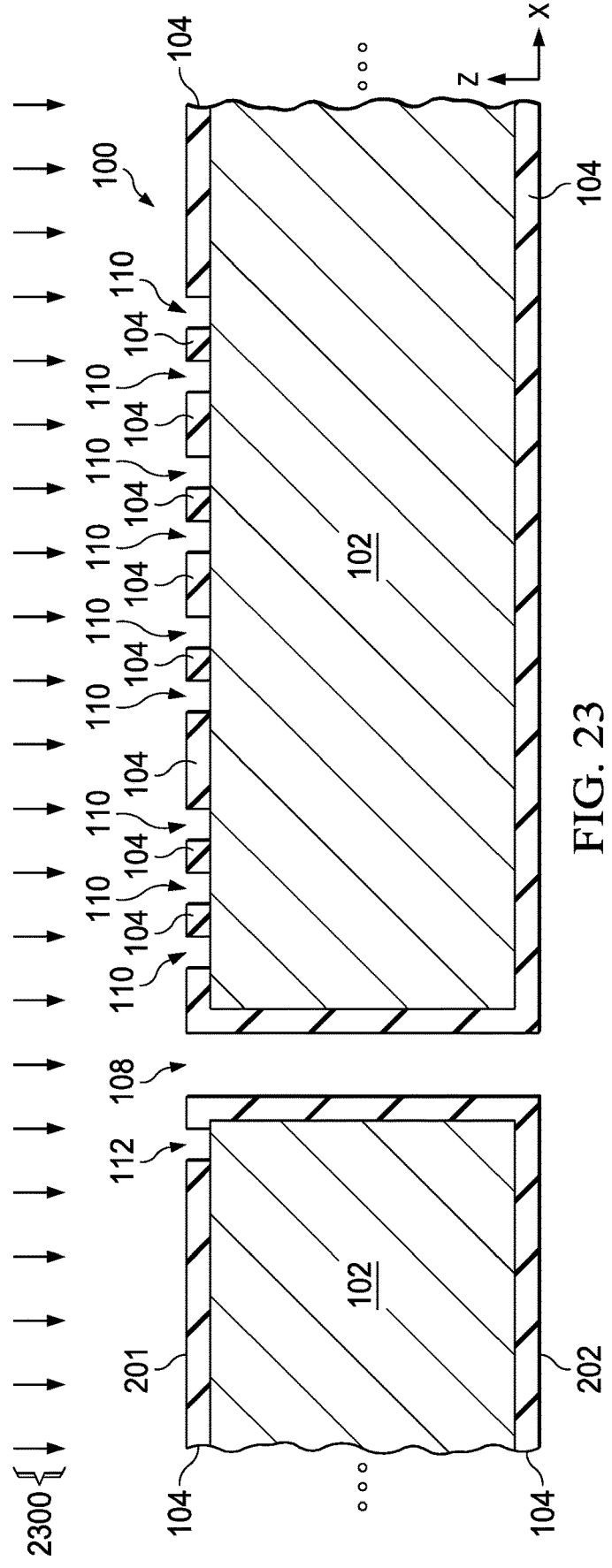
FIG. 23 is a partial sectional side elevation view of the lead frame following removal of the stencil.

The processing in FIG. 20 further includes plasma etching at 2004 and removal of the stencil 2102 at 2006. FIG. 22 shows one example, in which a plasma etch process 2200 is performed that removes the oxide layer 104 from the select areas of the surface of the metal structure 102 of the lead frame 100 to create the openings 110 and 112 that extend through the oxide layer 104 to expose portions of the surface of the metal structure 102. FIG. 23 shows the etched lead frame 100 after the stencil 2102 is removed at 2006 in FIG. 20. Plasma processing is generally a global process used to remove unwanted materials, and the stencil 2102 helps mitigate or avoid redistribution or "back-sputter" of exposed metal of the metal structure 102.

Described examples combine the mold adhesion advantages of the oxide layer 104 with improved solder wetting on bump and/or bond wire landings by selective oxide removal, along with lower cost and complexity compared with selective plating approaches. The selective oxide removal techniques can be used in combination with shrinking lead frame feature sizes to provide a low cost scalable solution that can be used with feature sizes smaller than is feasible using selective plating. For example, current limits of I/O pitch to 400 μm and lead frame width of 150 μm limits die shrink. Although the disclosed techniques can be used in combination with selective lead frame plating, lower cost lead frames are possible by eliminating Ni/Pd/Au finishes or other selective plating. The starting lead frame can be processed with brown oxide (BO) coating to provide a desired amount of surface roughness and better chemical/surface adhesion of the mold compound to the lead frame, while the selective oxide removal can be tailored to facilitate solderability to narrow bump pitch and narrow bump diameter features of the lead frame 100.

The above examples are merely illustrative of several possible implementations of various aspects of the present disclosure, wherein equivalent alterations and/or modifications will occur to others skilled in the art upon reading and understanding this specification and the annexed drawings. Modifications are possible in the described examples, and other implementations are possible, within the scope of the claims.

What is claimed is:

1. A lead frame, comprising:
   a metal structure;
   an oxide layer on a surface of the metal structure; and
   openings extending through the oxide layer to expose portions of the surface of the metal structure.

2. The lead frame of claim 1, wherein the openings include a bump landing arranged to accommodate direct soldering of a metal bump of a semiconductor die to an associated exposed portion of the surface of the metal structure.

3. The lead frame of claim 2, wherein the openings include a bond wire attachment location arranged to accommodate direct soldering of a bond wire to an associated exposed portion of the surface of the metal structure.

4. The lead frame of claim 1, wherein the openings include a bond wire attachment location arranged to accommodate direct soldering of a bond wire to an associated exposed portion of the surface of the metal structure.

5. An electronic device, comprising:
a semiconductor die supported in a package structure;
a metal structure, including an oxide layer on a surface of the metal structure, and openings that extend through the oxide layer to expose portions of the surface of the metal structure;
an electrical connection between a conductive feature of the semiconductor die and an exposed portion of the surface of the metal structure in one of the openings through the oxide layer.

6. The electronic device of claim 5, wherein the openings include a bump landing soldered to a metal bump of the semiconductor die.

7. The electronic device of claim 6, wherein the openings further include a bond wire attachment location soldered to a bond wire.

8. The electronic device of claim 6, wherein the openings are laser ablated through the oxide layer to expose the portions of the surface of the metal structure.

9. The electronic device of claim 5, wherein the openings further include a bond wire attachment location soldered to a bond wire.

10. The electronic device of claim 9, wherein the openings are laser ablated through the oxide layer to expose the portions of the surface of the metal structure.

11. The electronic device of claim 5, wherein the openings are laser ablated through the oxide layer to expose the portions of the surface of the metal structure.

12. The electronic device of claim 5, wherein the openings are chemical etched through the oxide layer to expose the portions of the surface of the metal structure.

13. The electronic device of claim 5, wherein the openings are plasma etched through the oxide layer to expose the portions of the surface of the metal structure.

14. An electronic device, comprising:
an oxide layer on a surface of a metal structure of a lead frame;
openings extending through the oxide layer exposing portions of the surface of the metal structure;
a conductive feature of a semiconductor die connected to a surface of the metal structure; and
a package structure covering the semiconductor die and the lead frame.

15. The electronic device of claim 14, wherein a solder wetted metal bump of the semiconductor die is attached to an exposed portion of the surface of the metal structure in a bump landing opening through the oxide layer.

16. The electronic device of claim 15, wherein a first end of a bond wire is soldered to an exposed portion of the surface of the metal structure in a bond wire attachment location opening through the oxide layer and a second end of the bond wire is soldered to a conductive feature of the semiconductor die.

17. The electronic device of claim 14, wherein a first end of a bond wire is soldered to an exposed portion of the surface of the metal structure in a bond wire attachment location opening through the oxide layer and a second end of the bond wire is soldered to a conductive feature of the semiconductor die.

18. The electronic device of claim 14, wherein the openings include a bump landing soldered to a metal bump of the semiconductor die.

19. The electronic device of claim 18, wherein the openings further include a bond wire attachment location soldered to a bond wire.

20. The electronic device of claim 5, wherein the openings are laser ablated through the oxide layer to expose the portions of the surface of the metal structure.

* * * * *